United States Patent
Kadota et al.

(10) Patent No.: US 6,836,196 B2
(45) Date of Patent: Dec. 28, 2004

(54) SURFACE ACOUSTIC WAVE APPARATUS UTILIZING A LEAKY SURFACE ACOUSTIC WAVE

(75) Inventors: Michio Kadota, Kyoto (JP); Takeshi Nakao, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 49 days.

(21) Appl. No.: 10/329,950

(22) Filed: Dec. 27, 2002

(65) Prior Publication Data

US 2003/0141947 A1 Jul. 31, 2003

(30) Foreign Application Priority Data

Dec. 28, 2001 (JP) .................................... 2001-400737
Dec. 3, 2002 (JP) .................................... 2002-351134

(51) Int. Cl.[7] ............................................. H03H 9/64
(52) U.S. Cl. ................... 333/193; 333/195; 310/313 A
(58) Field of Search ............................. 333/193–196; 310/313 A

(56) References Cited

U.S. PATENT DOCUMENTS

| | | | | |
|---|---|---|---|---|
| 4,978,879 A | * | 12/1990 | Satoh et al. | 310/313 A |
| 5,729,186 A | * | 3/1998 | Seki et al. | 333/194 |
| 5,844,347 A | * | 12/1998 | Takayama et al. | 310/313 R |
| 6,037,847 A | * | 3/2000 | Ueda et al. | 333/193 |
| 6,317,014 B1 | * | 11/2001 | Kadota | 333/133 |
| 6,317,015 B1 | * | 11/2001 | Ueda et al. | 333/193 |
| 6,366,002 B1 | * | 4/2002 | Kadota | 310/313 A |
| 6,522,219 B2 | * | 2/2003 | Takamiya et al. | 333/133 |
| 6,556,104 B2 | * | 4/2003 | Naumenko et al. | 333/193 |

FOREIGN PATENT DOCUMENTS

| | | | | |
|---|---|---|---|---|
| EP | 0 734 120 A1 | * | 9/1996 | |
| JP | 61-136312 | | 6/1986 | |
| JP | 2-37815 | * | 2/1990 | ................ 333/193 |
| JP | 02-295212 | | 12/1990 | |
| JP | 4-258008 | * | 9/1992 | |
| JP | 06-164306 | | 6/1994 | |
| JP | 7-212176 | * | 8/1995 | |
| JP | 9-186542 | * | 7/1997 | |
| JP | 11-186866 | | 7/1999 | |
| JP | 2001-77662 | * | 3/2001 | ............. 415/209.1 |

OTHER PUBLICATIONS

AP James J. Campbell et al., "A Method for Estimating Optimal Crystal Cuts and Propagation Directions for Excitation of Plezoelectric Surface Waves", IEEE Transactions on Sonics and Ultrasonics, vol. SU–15, No. 4, Oct. 1968, pp. 209–217.

AR O. Kawachi et al., "Optimum Cut of LiTaO$_3$ for High Performance Leaky Surface Acoustic Wave Filters", 1996 IEEE Ultrasonics Symposium, pp. 71–76.

* cited by examiner

*Primary Examiner*—Barbara Summons
(74) *Attorney, Agent, or Firm*—Keating & Bennett LLP

(57) ABSTRACT

A surface acoustic wave apparatus has an improved frequency temperature characteristic due to an arrangement of a SiO$_2$ film on an IDT such that cracks in the SiO$_2$ film surface are prevented from occurring, desired characteristics are reliably achieved, the electromechanical coefficient is increased, and the attenuation constant α is reduced. The surface acoustic wave apparatus includes at least one IDT primarily including Cu and arranged on a 23° to 46°-rotated Y plate LiTaO$_3$ substrate. The SiO$_2$ film is arranged on the LiTaO$_3$ substrate so as to cover the at least one IDT.

21 Claims, 18 Drawing Sheets

BEFORE FILM FORMATION

Al/LT

CRACK

AFTER FILM FORMATION

SiO$_2$/Al/LT

SURFACE ACOUSTIC WAVE APPARATUS UTILIZING A LEAKY SURFACE ACOUSTIC WAVE

BACKGROUND OF THE INVENTION

1. Field of the Invention

The present invention relates to a surface acoustic wave apparatus for use in, for example, a resonator, band-pass filter, or other suitable device. In particular, the present invention relates to a surface acoustic wave apparatus using a rotated Y plate X-propagating LiTaO$_3$ substrate and a method for manufacturing the same.

2. Description of the Related Art

In mobile communication apparatuses, for example, cellular phones, surface acoustic wave filters have been used as RF stage band-pass filters and duplexers. As this sort of surface acoustic wave filter, a surface acoustic wave filter using a leaky surface acoustic wave has been used and includes an IDT (Interdigital Transducer) made of Al arranged on a 30° to 50°-rotated Y plate X-propagating LiTaO$_3$ substrate.

However, this surface acoustic wave filter has a poor frequency temperature characteristic of −30 ppm/° C. to −40 ppm/° C. and, therefore, improvements thereto are required. In order to improve the frequency temperature characteristic, a structure has been suggested, in which an IDT made of Al has been formed on the 30° to 50°-rotated Y plate X-propagating LiTaO$_3$ substrate and, thereafter, a SiO$_2$ film has been further laminated. The frequency temperature characteristic is improved by the arrangement of the SiO$_2$ film.

When the IDT made of Al is formed, the electrode film thickness H/λ (H denotes a film thickness and λ denotes a wavelength of a surface acoustic wave) of the IDT is significantly increased to 0.08 to 0.10 in order to increase the reflection coefficient and electromechanical coefficient K$^2$. Since the IDT made of Al was allowed to have a significant thickness as described above, regarding the portion shown in FIG. 18A, when the SiO$_2$ film was formed thereon in order to improve the frequency temperature characteristic, large height differences occurred in the SiO$_2$ film and, thereby, cracks sometimes occurred in the SiO$_2$ film as shown in FIG. 18B. Consequently, the filter characteristics of the surface acoustic wave filter were degraded due to the occurrence of the cracks.

In addition, since the electrode film thickness of the IDT made of Al is large, an effect of covering the differences in the electrode surface of the IDT based on the arrangement of the SiO$_2$ film was not adequate and, thereby, the temperature characteristic was not always improved adequately.

Furthermore, the attenuation constant was increased due to the arrangement of the SiO$_2$ film and, thereby, degradation of the filter characteristics occurred.

SUMMARY OF THE INVENTION

In order to overcome the problems described above, preferred embodiments of the present invention provide a surface acoustic wave apparatus and a method for manufacturing the same, wherein the surface acoustic wave apparatus includes a rotated Y plate X-propagating LiTaO$_3$ substrate having a unique arrangement of a SiO$_2$ film such that the frequency temperature characteristic is greatly improved, the electrode film thickness of the IDT can be significantly reduced, cracking in the SiO$_2$ film is prevented and, furthermore, the attenuation constant is reduced by a large degree, so that targeted electrical characteristics, for example, desired filter characteristics, can be attained, and the electromechanical coefficient and reflection coefficient in the IDT are allowed to have adequate values.

According to a preferred embodiment of the present invention, a surface acoustic wave apparatus includes a LiTaO$_3$ substrate having Euler angles (0±3°, 113° to 136°, 0±3°), at least one IDT which is arranged on the LiTaO$_3$ substrate and which primarily includes Cu, and a SiO$_2$ film arranged on the LiTaO$_3$ substrate to cover the at least one IDT.

In preferred embodiments of the present invention, since the IDT primarily includes Cu, and the SiO$_2$ film is arranged in a unique manner, the electromechanical coefficient is increased, and the frequency temperature characteristic is improved. Furthermore, since the LiTaO$_3$ substrate having the specific desired Euler angles is used, the attenuation constant α is greatly reduced.

In another preferred embodiment of the present invention, preferably, the film thickness H/λ of the IDT normalized by the wavelength of the surface acoustic wave is preferably within the range of about 0.01 to about 0.08, and the film thickness H/λ of the SiO$_2$ film normalized by the wavelength of the surface acoustic wave is preferably within the range of about 0.15 to about 0.40. In that case, according to preferred embodiments of the present invention, a surface acoustic wave apparatus which has a large electromechanical coefficient and reflection coefficient, excellent frequency temperature characteristic, and adequately reduced attenuation constant and in which cracking in the SiO$_2$ film are prevented from occurring can be provided with reliability.

In a preferred embodiment of the present invention, preferably, the film thickness H/λ of the IDT is about 0.12 or less, and the combination of the normalized film thickness of the SiO$_2$ and the Euler angles of the LiTaO$_3$ substrate is any one of the values shown in the following Table.

TABLE 3

| SiO$_2$ film thickness | Euler angles of LiTaO$_3$ | More preferably |
|---|---|---|
| 0.15 to 0.18 | (0, 117 to 137, 0) | (0, 120 to 135, 0) |
| 0.18 to 0.23 | (0, 117 to 136, 0) | (0, 118 to 133, 0) |
| 0.23 to 0.28 | (0, 115 to 135, 0) | (0, 117 to 133, 0) |
| 0.28 to 0.33 | (0, 113 to 133, 0) | (0, 115 to 132, 0) |
| 0.33 to 0.38 | (0, 113 to 135, 0) | (0, 115 to 133, 0) |
| 0.38 to 0.40 | (0, 113 to 132, 0) | (0, 115 to 130, 0) |

In another preferred embodiment of the present invention, preferably, when the normalized film thickness of the SiO$_2$ film is represented by hs, the θ of the Euler angles (0°, θ, 0°) fall within the range of the following Formula (1):

$$\theta_{min}-2° \leq \theta \leq \theta_{min}+2°  \quad \text{Formula (1)}$$

where in the Formula (1), when the normalized film thickness H/λ of the IDT is within the range of the following (a) to (e), the value of $\theta_{min}$ is represented by the following Formulae A to E, respectively.

(a) when 0<H/λ≦0.01

$$\theta_{min}=-139.713 \times hs^3 + 43.07132 \times hs^2 - 20.568011 \times hs + 125.8314 \quad \text{Formula A}$$

(b) when 0.01<H/λ≦0.03

$$\theta_{min}=-139.660 \times hs^3 + 46.02985 \times hs^2 - 21.141500 \times hs + 127.4181 \quad \text{Formula B}$$

(c) when $0.03 < H/\lambda \leq 0.05$ $$\theta_{min} = -139.607 \times hs^3 + 48.98838 \times hs^2 - 21.714900 \times hs + 129.0048 \quad \text{Formula C}$$

(d) when $0.05 < H/\lambda \leq 0.07$ $$\theta_{min} = -112.068 \times hs^3 + 39.60355 \times hs^2 - 21.186000 \times hs + 129.9397 \quad \text{Formula D}$$

(e) when $0.07 < H/\lambda \leq 0.09$ $$\theta_{min} = -126.954 \times hs^3 + 67.40488 \times hs^2 - 29.432000 \times hs + 131.5686 \quad \text{Formula E}$$

In a preferred embodiment of the present invention, preferably, the combination of the normalized film thickness of the $SiO_2$ and the Euler angles of the $LiTaO_3$ substrate is any of the values specified in the following Table.

TABLE 4

| $SiO_2$ film thickness | Euler angles of $LiTaO_3$ |
|---|---|
| 0.15 to 0.18 | (0, 117 to 125, 0) |
| 0.18 to 0.23 | (0, 117 to 125, 0) |
| 0.23 to 0.28 | (0, 115 to 125, 0) |
| 0.28 to 0.33 | (0, 113 to 125, 0) |
| 0.33 to 0.38 | (0, 113 to 125, 0) |
| 0.38 to 0.40 | (0, 113 to 125, 0) |

In the case of the combinations shown in the aforementioned Table, that is, in the case where the θ of the Euler angles is specified to be about 125° or less, the electromechanical coefficient $K^2$ is be further increased.

In the surface acoustic wave apparatus according to a preferred embodiment of the present invention, preferably, a leaky surface acoustic wave including a shear horizontal wave as a main component is used as the surface acoustic wave. According to preferred embodiments of the present invention, a surface acoustic wave apparatus having an excellent frequency temperature characteristic, an IDT with a large electromechanical coefficient and a reflection coefficient, and a small propagation loss can be provided.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 18A and 18B are scanning electron micrographs for explaining problems in a conventional surface acoustic wave apparatus in which FIG. 18A shows the condition before formation of a $SiO_2$ film, and FIG. 18B shows the surface condition of the $SiO_2$ film after formation of the $SiO_2$ film.

DETAILED DESCRIPTION OF PREFERRED EMBODIMENTS

The present invention will be made clear by describing specific preferred embodiments of the present invention below with reference to the drawings.

Figure 1:
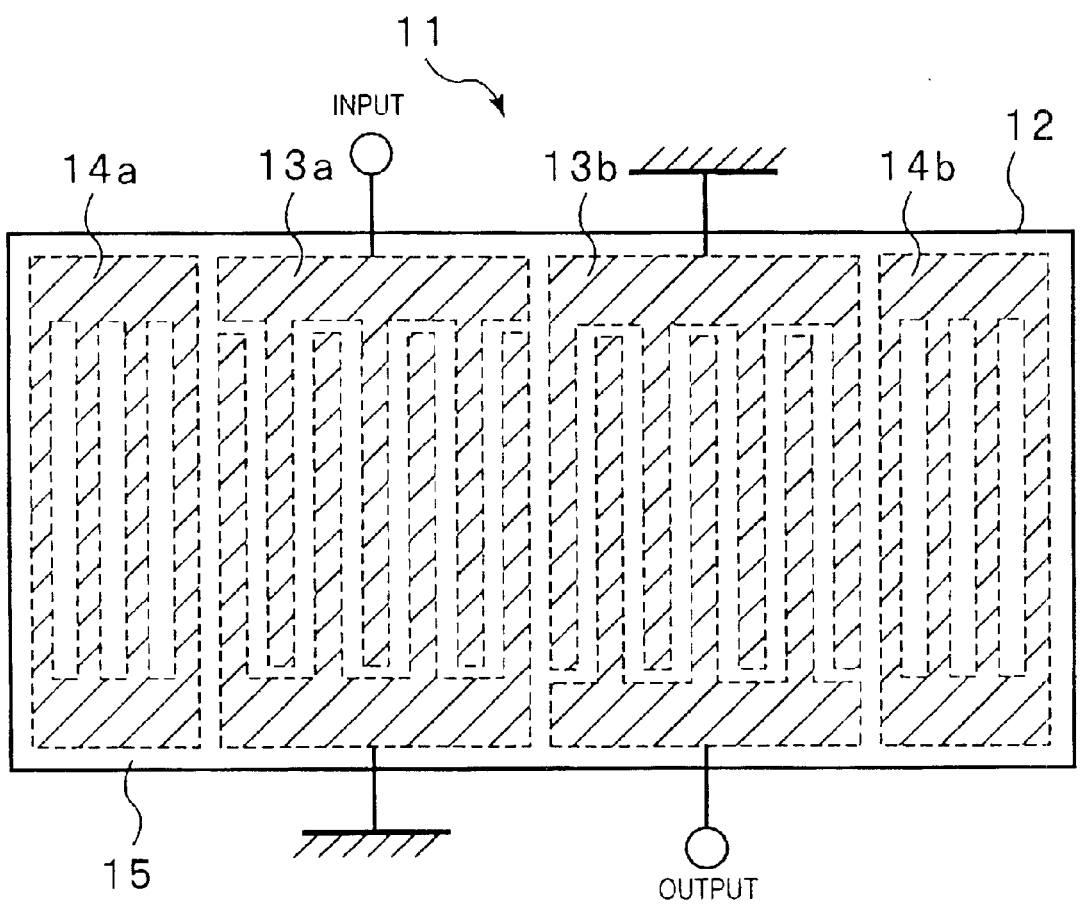
FIG. 1 is a plan view showing a surface acoustic wave apparatus according to a preferred embodiment of the present invention.

FIG. 1 is a plan view for explaining a longitudinally coupled resonator filter as a surface acoustic wave apparatus according to a preferred embodiment of the present invention.

A surface acoustic wave apparatus 11 has a structure in which IDTs 13a and 13b and reflectors 14a and 14b are arranged on the top surface of a $LiTaO_3$ substrate 12. A $SiO_2$ film 15 is arranged so as to cover the IDTs 13a and 13b and reflectors 14a and 14b. As the $LiTaO_3$ substrate 12, a 23° to 46°-rotated Y plate $LiTaO_3$ substrate is preferably used. With rotated Y plate X-propagating $LiTaO_3$ substrates having cut angles outside this range, attenuation constants are increased and TCFs are degraded.

The IDTs 13a and 13b and reflectors 14a and 14b are preferably made of Cu having a density higher than that of Al.

Since the IDTs 13a and 13b and reflectors 14a and 14b are preferably made of Cu having a density that is higher than that of Al as described above, even when the film thicknesses of the IDTs 13a and 13b and reflectors 14a and 14b are reduced compared with those in the case where Al is used, the electromechanical coefficient and the reflection coefficient can be increased.

Figure 16:
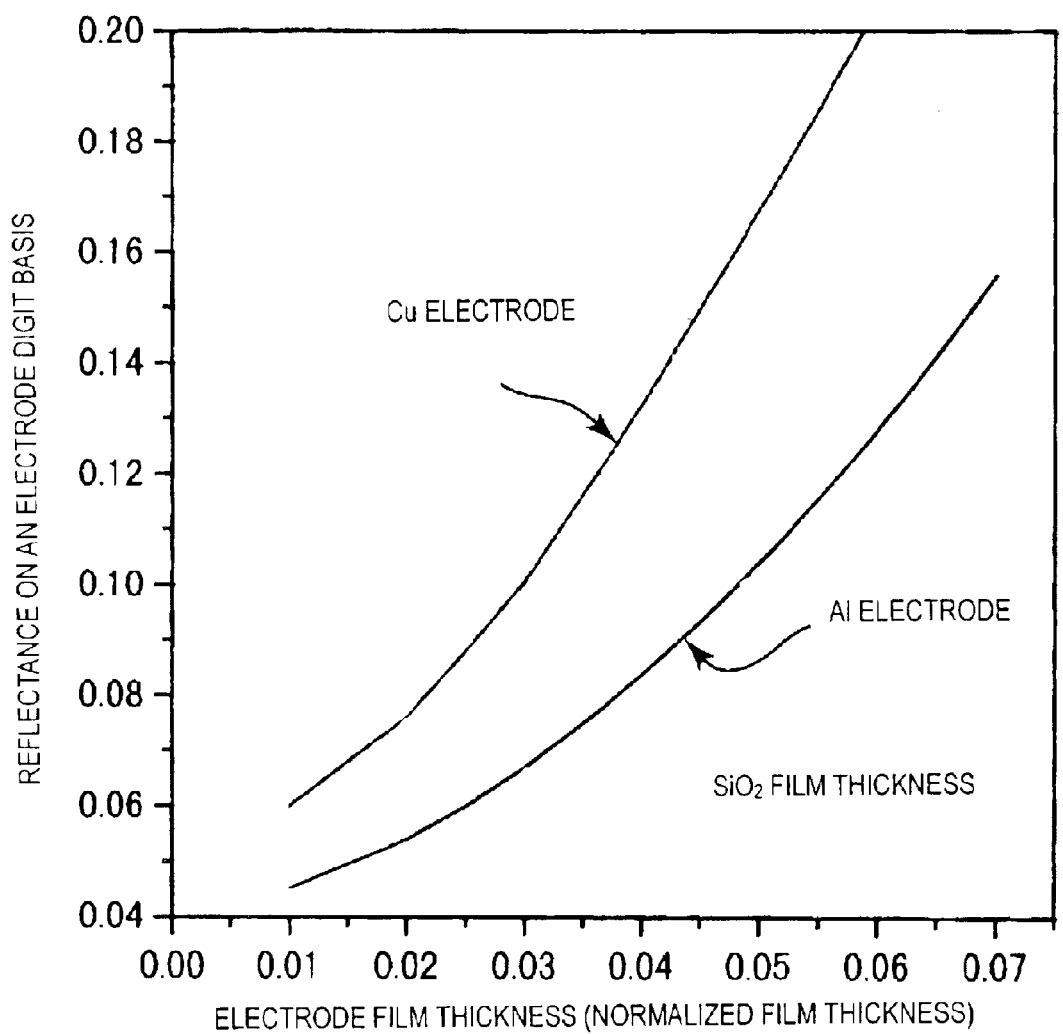
FIG. 16 is a diagram showing the relationship between the reflectance on an electrode digit basis and the electrode film thickness of an electrode made of Al and an electrode made of Cu when the normalized film thickness of a $SiO_2$ film is about 0.02.

FIG. 16 is a diagram showing the relationship between the reflectance on an electrode digit basis and the electrode film thickness of a Cu electrode and an Al electrode when the normalized film thickness of a $SiO_2$ film is about 0.20.

As shown in FIG. 16, when the electrode made of Cu is used, the reflectance on an electrode digit basis can be increased compared with that of the conventionally used electrode made of Al and, therefore, the number of digits in the reflector can be reduced. Consequently, miniaturization of the reflector and, by extension, miniaturization of the surface acoustic wave apparatus can be achieved.

Since the electrode film thickness can be reduced as described above, the occurrence of cracks due to height differences of the $SiO_2$ film 15 arranged on the IDTs 13a and 13b is reliably prevented. Regarding the thickness of the $SiO_2$ film 15, as is clear from experimental examples described later, the film thickness H/λ normalized by the wavelength of the surface acoustic wave is preferably within the range of about 0.15 to about 0.40. When the film thickness falls within this range, the attenuation constant can be decreased by a large degree compared with that in the case where the $SiO_2$ film is not arranged and, therefore, reduction of loss can be achieved.

As described later, the film thicknesses H/λ normalized by the wavelength of the surface acoustic wave of the IDTs 13a and 13b are preferably about 0.01 to about 0.08.

In the surface acoustic wave apparatus according to preferred embodiments of the present invention, as described above, since the IDTs 13a and 13b are made of Cu on the $LiTaO_3$ substrate 12, the electrode film thicknesses of the IDTs 13a and 13b can be decreased. Consequently, the occurrence of height differences in the $SiO_2$ film is reliably prevented, and cracking is also reliably prevented. Furthermore, since the $LiTaO_3$ substrate having specific Euler angles is used, the attenuation constant can be reduced by a large degree, and reduction of loss can be achieved. In addition, excellent frequency temperature characteristics can be achieved by arrangement of the $SiO_2$ film 15. This will be described based on the specific experimental examples.

Surface acoustic waves which propagate through the $LiTaO_3$ substrate include a leaky surface acoustic wave (LSAW) other than a Rayleigh wave. The leaky surface acoustic wave has a large sound velocity and a large electromechanical coefficient compared with those of the Rayleigh wave, and propagates while releasing energy in the substrate. Consequently, the leaky surface acoustic wave has an attenuation constant which causes propagation loss.

Figure 3:
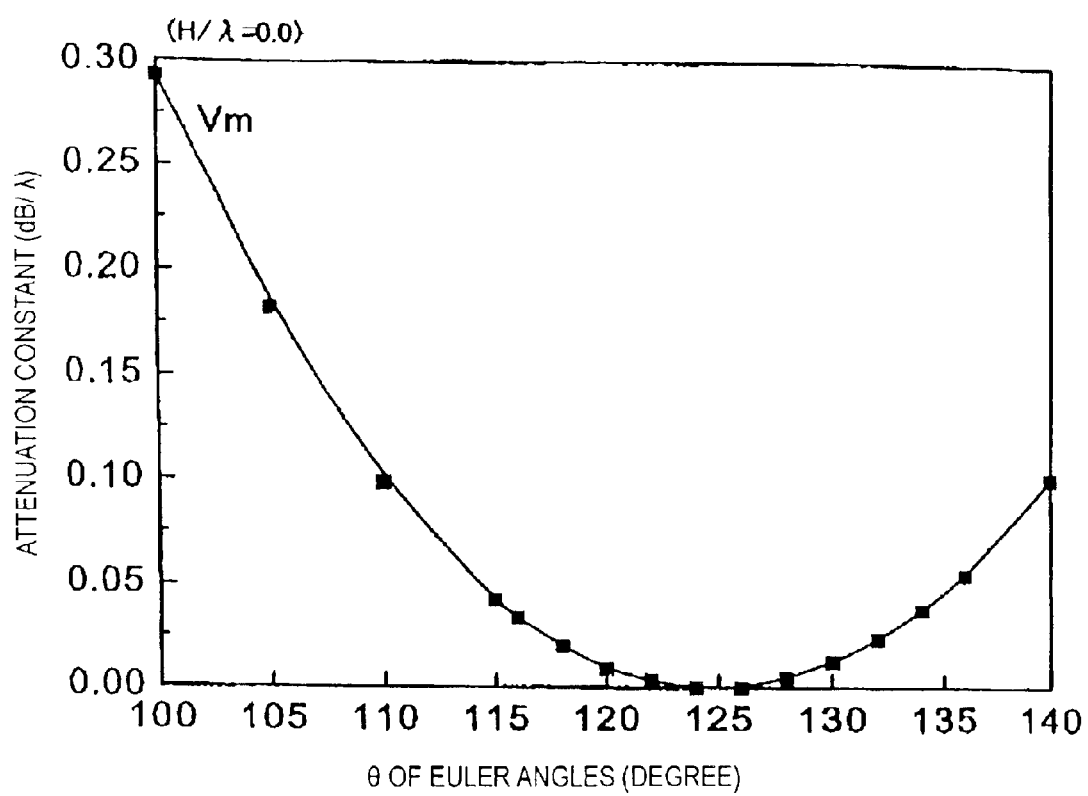
FIG. 3 is a diagram showing the relationship between the θ and the attenuation constant α on the $LiTaO_3$ substrate having Euler angles (0°, θ, 0°).

FIG. 3 shows the relationship between the θ of the Euler angles (0°, θ, 0°) and the attenuation constant α when the substrate surface is electrically short-circuited regarding the rotated Y plate X-propagating $LiTaO_3$ substrate. There is a relationship in which the rotation angle is substantially equal to θ-90°.

As is clear from FIG. 3, the attenuation constant α is small when the θ of the Euler angles is within the range of about 124° to about 126°, and the attenuation constant α is increased outside this range. It is known that in the case where an IDT made of Al having relatively large thickness is used, the attenuation constant becomes small when the θ is about 129° to about 136°. Therefore, conventionally, when the IDT made of Al was used, a $LiTaO_3$ substrate in which the θ of the Euler angles was within the range of about 129° to about 136° was used.

Figure 2:
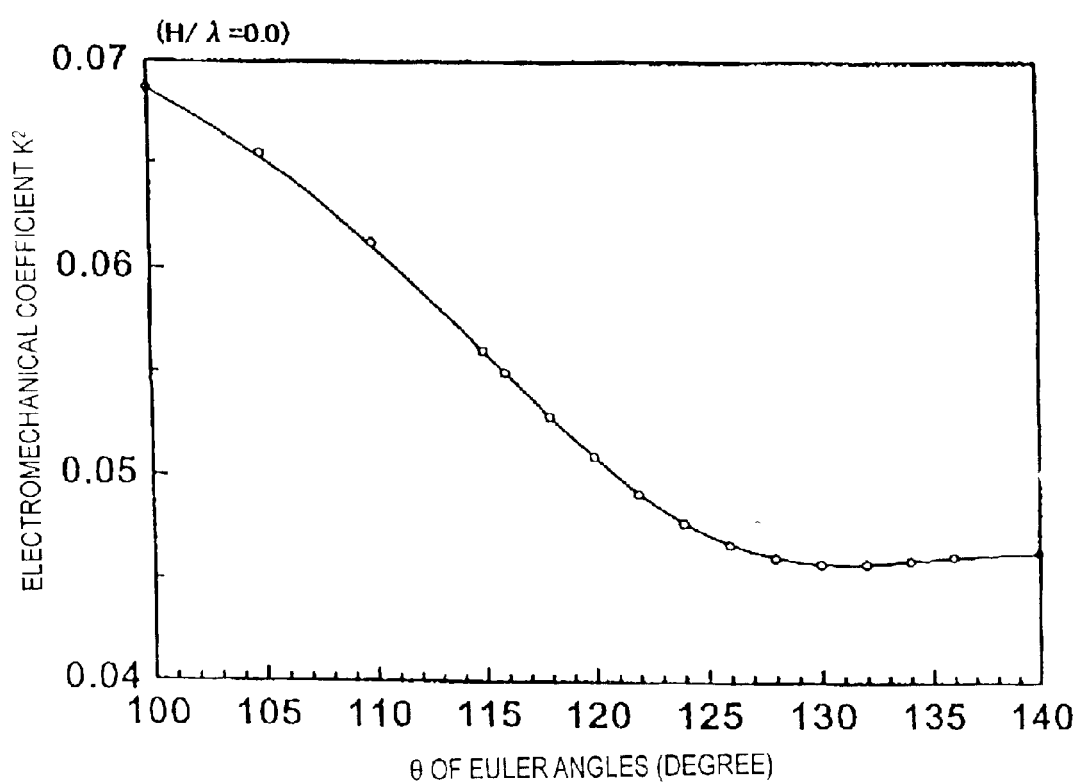
FIG. 2 is a diagram showing the relationship between the θ and the electromechanical coefficient $K^2$ on the $LiTaO_3$ substrate having Euler angles (0°, θ, 0°).

FIG. 2 shows the relationship between the θ of the Euler angles and the electromechanical coefficient $K^2$. As is clear from FIG. 2, a large electromechanical coefficient $K^2$ can be achieved when the θ of the Euler angles is within the range of about 100° to about 120°. However, as is clear from FIG. 3, since the attenuation constant α is large when the θ is within the range of about 100° to about 120°, the $LiTaO_3$ substrate having a θ of about 100° to about 120° cannot be used for the surface acoustic wave apparatus.

Figure 4:
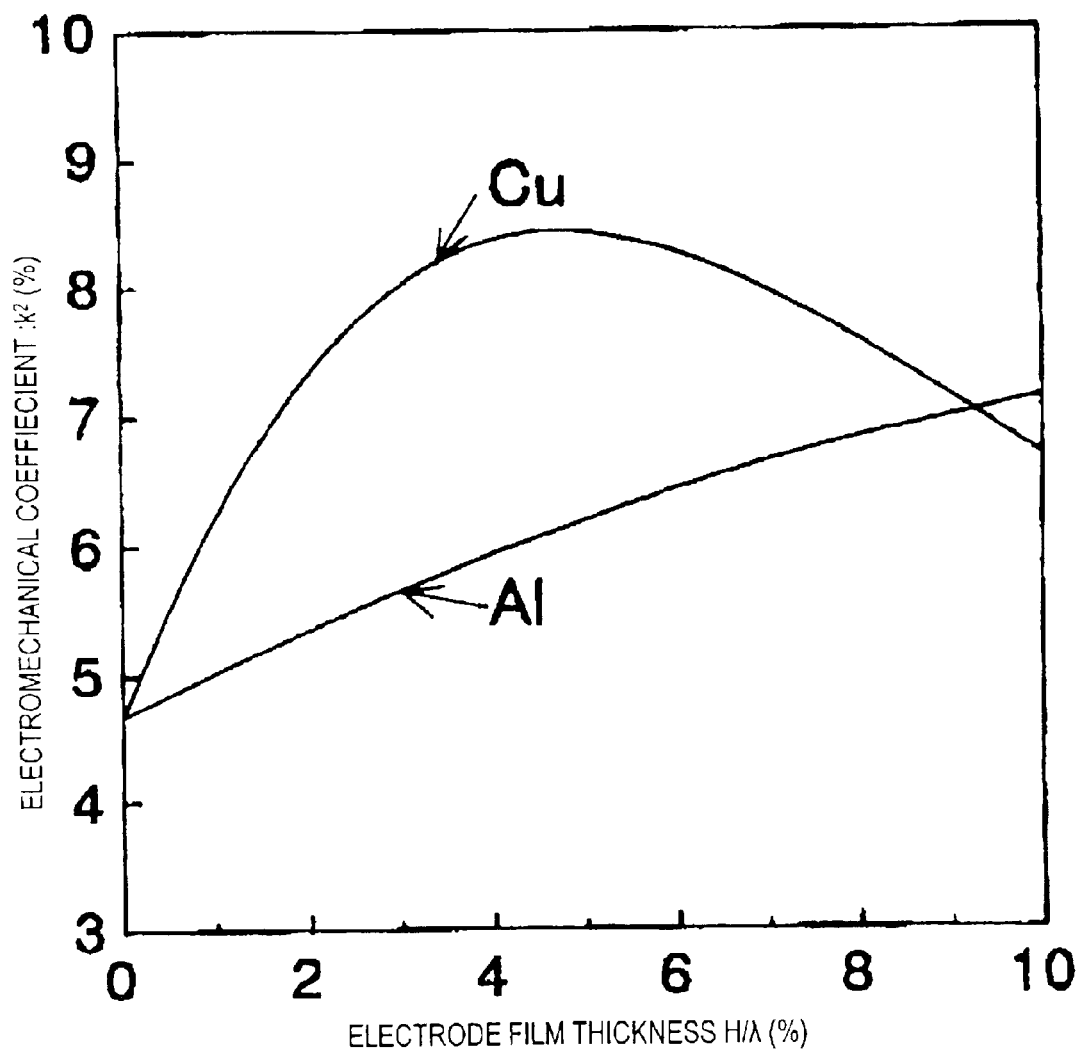
FIG. 4 is a diagram showing the relationship between the normalized film thickness H/λ of Cu or Al film and the electromechanical coefficient $K^2$ when electrodes made of Cu or Al films having various film thicknesses are arranged on respective $LiTaO_3$ substrates having Euler angles (0°, 126°, 0°).

FIG. 4 shows the relationship between the normalized film thickness H/λ of a Cu film and the electromechanical coefficient $K^2$ when an IDT made of Cu is arranged on a 36°-rotated Y plate X-propagating $LiTaO_3$ substrate (Euler angles (0°, 126°, 0°)). Here, λ denotes a wavelength at a center frequency of a surface acoustic wave apparatus.

As is clear from FIG. 4, when the film thickness H/λ of the Cu film is within the range of about 0.01 to about 0.10, the electromechanical coefficient $K^2$ is approximately 1.5 times or more than that in the case where no Cu film is arranged (H/λ=0), when the film thickness H/λ of the Cu film is within the range of about 0.02 to about 0.08, the electromechanical coefficient $K^2$ takes on a value that is approximately 1.8 times or more than that in the case where no Cu film is arranged, and when the film thickness H/λ of the Cu film is within the range of about 0.03 to about 0.06, the electromechanical coefficient $K^2$ takes on a value that is approximately 2 times or more than that in the case where no Cu film is arranged. Furthermore, the electromechanical coefficient $K^2$ takes on a maximum value at a small film thickness H/λ on the order of about 0.04 compared with that of Al used conventionally, and the value is larger than that of Al.

When the normalized film thickness H/λ of the Cu film exceeds approximately 0.08, manufacture of an IDT made of the Cu film becomes difficult. Consequently, in order that a large electromechanical coefficient can be achieved, and the IDT is manufactured with ease, the thickness of the IDT made of the Cu film is desirably within the range of about 0.01 to about 0.08, more preferably, is specified to be within the range of about 0.02 to about 0.08, and further preferably, be within the range of about 0.03 to about 0.06.

Figure 5:
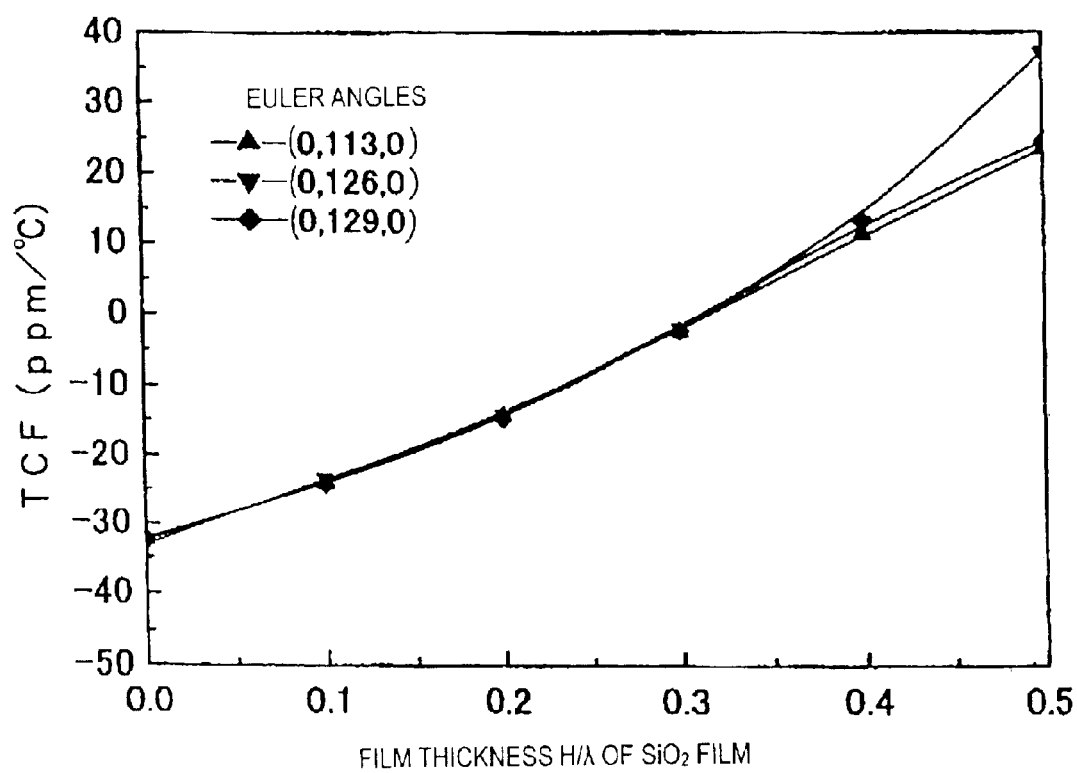
FIG. 5 is a diagram showing the relationship between the normalized film thickness H/λ of a $SiO_2$ film and the temperature coefficient of resonant frequency TCF when $SiO_2$ films having various film thicknesses are arranged without arrangement of any electrode on three types of $LiTaO_3$ substrates, each having Euler angles (0°, 113°, 0°), (0°, 126°, 0°), or (0°, 129°, 0°).

Changes in the temperature coefficient of resonant frequency TCF when a $SiO_2$ film is arranged on a $LiTaO_3$ substrate are shown in FIG. 5. FIG. 5 shows the relationship between the normalized film thickness H/λ of the $SiO_2$ film and the TCF when $SiO_2$ films are arranged on three types of $LiTaO_3$ substrate, each having Euler angles (0°, 113°, 0°), (0°, 126°, 0°), or (0°, 129°, 0°). No electrode is provided in this case.

As is clear from FIG. 5, in each of the cases where the angle θ is 113°, 126°, and 129°, the TCF falls within the range of about −20 to about +17 ppm/° C. when the normalized film thickness H/λ of the $SiO_2$ film is within the range of about 0.15 to about 0.45. However, since film formation of the $SiO_2$ film takes much time, the film thickness H/λ of the $SiO_2$ film is preferably about 0.15 to about 0.40.

It has been known that the TCFs of the Rayleigh wave, etc., have been improved by arrangement of the $SiO_2$ film on the $LiTaO_3$ substrate. However, regarding a structure in which the electrode made of Cu is arranged on the $LiTaO_3$ substrate, and the $SiO_2$ film is further laminated, it has not been reported that any actual experiment was performed in consideration of the thickness of the electrode made of Cu, the film thickness of the $SiO_2$, the cut angle, and the attenuation constant of the leaky elastic wave.

Figure 6:
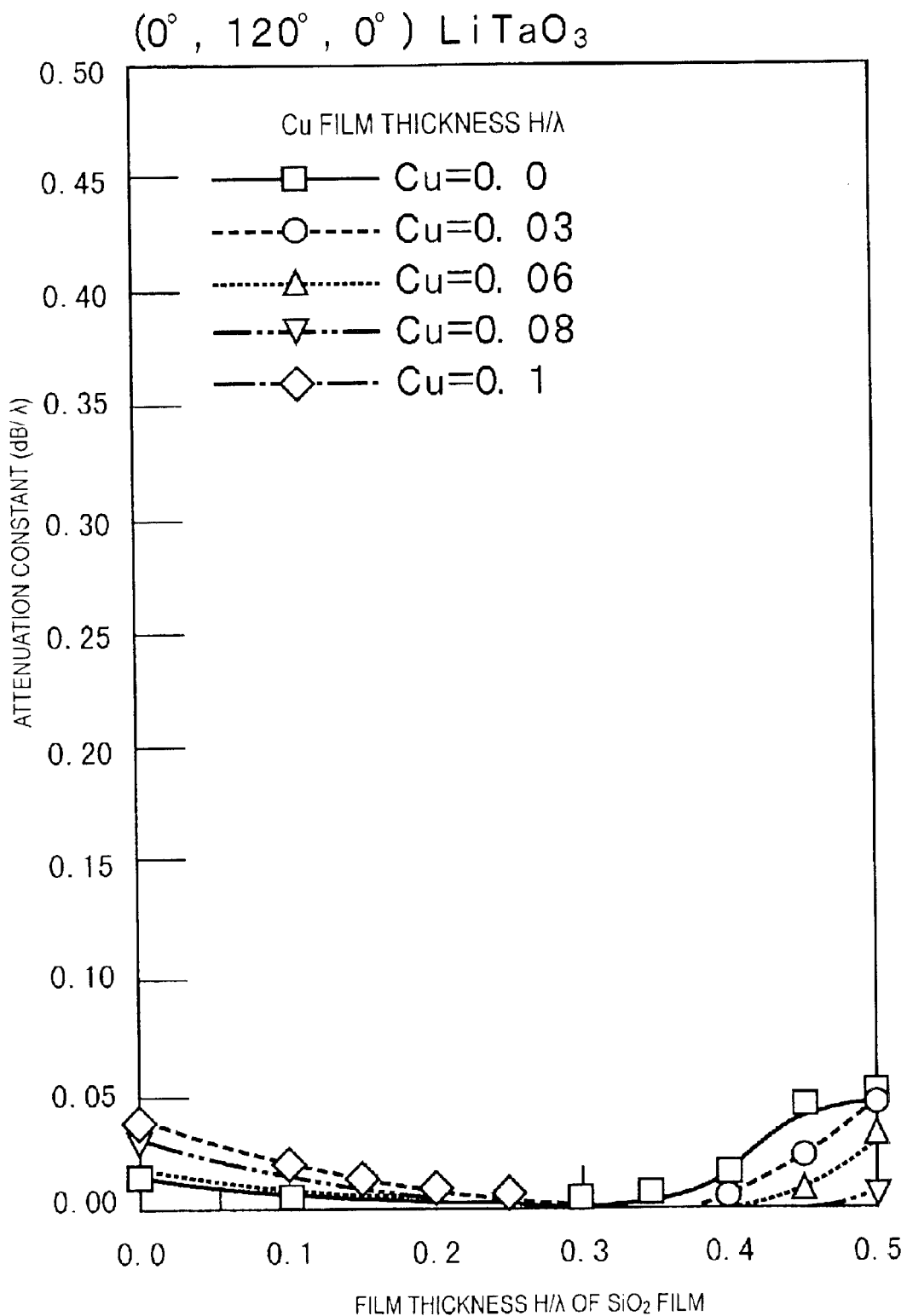
FIG. 6 is a diagram showing changes in the attenuation constant α when Cu films having normalized film thicknesses of about 0.1 or less are arranged on respective $LiTaO_3$ substrates having Euler angles (0°, 120°, 0°), and respective $SiO_2$ films having normalized film thicknesses of about 0 to about 0.5 are arranged.

FIG. 6 shows changes in the attenuation constant α when an electrode made of Cu having a normalized film thickness H/λ of about 0.10 or less and a $SiO_2$ film having a normalized film thickness H/λ of about 0 to about 0.5 are arranged on a $LiTaO_3$ substrate having Euler angles (0°, 120°, 0°). As is clear from FIG. 6, when the film thickness H/λ of the $SiO_2$ film is about 0.2 to about 0.40, and the film thickness H/λ of the Cu film is about 0.01 to about 0.10, the attenuation constant α becomes small.

Figure 7:
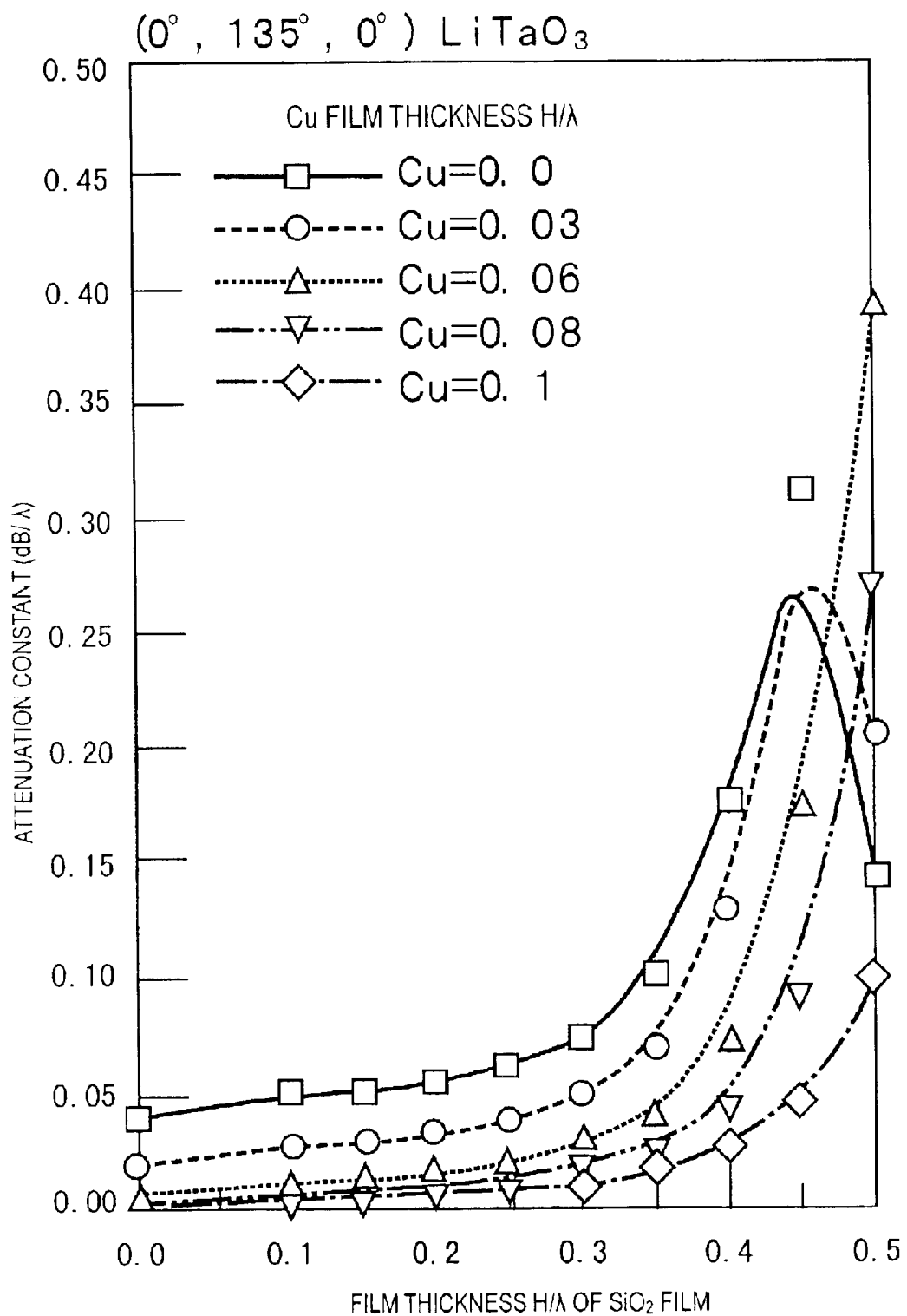
FIG. 7 is a diagram showing changes in the attenuation constant α when Cu films having normalized film thicknesses of about 0.1 or less are arranged on respective $LiTaO_3$ substrates having Euler angles (0°, 135°, 0°), and respective $SiO_2$ films having normalized film thicknesses of about 0 to about 0.5 are arranged.
Figure 8:
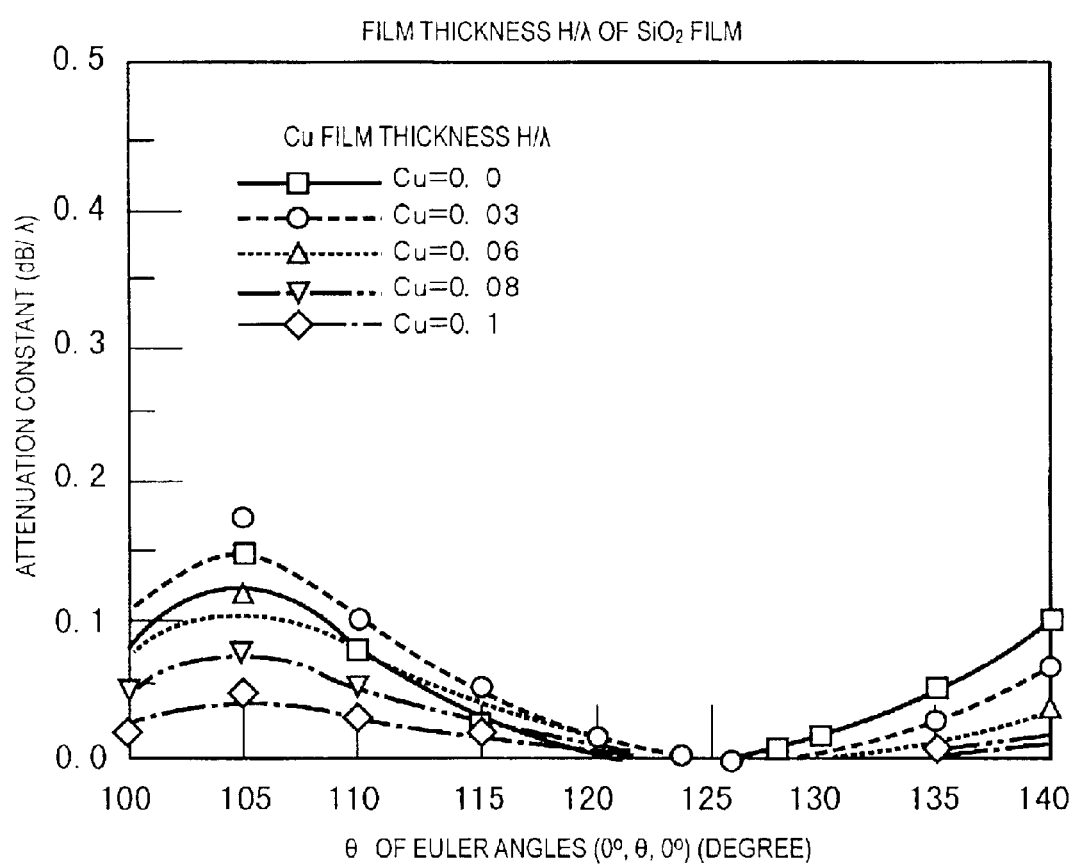
FIG. 8 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.1 are laminated.
Figure 9:
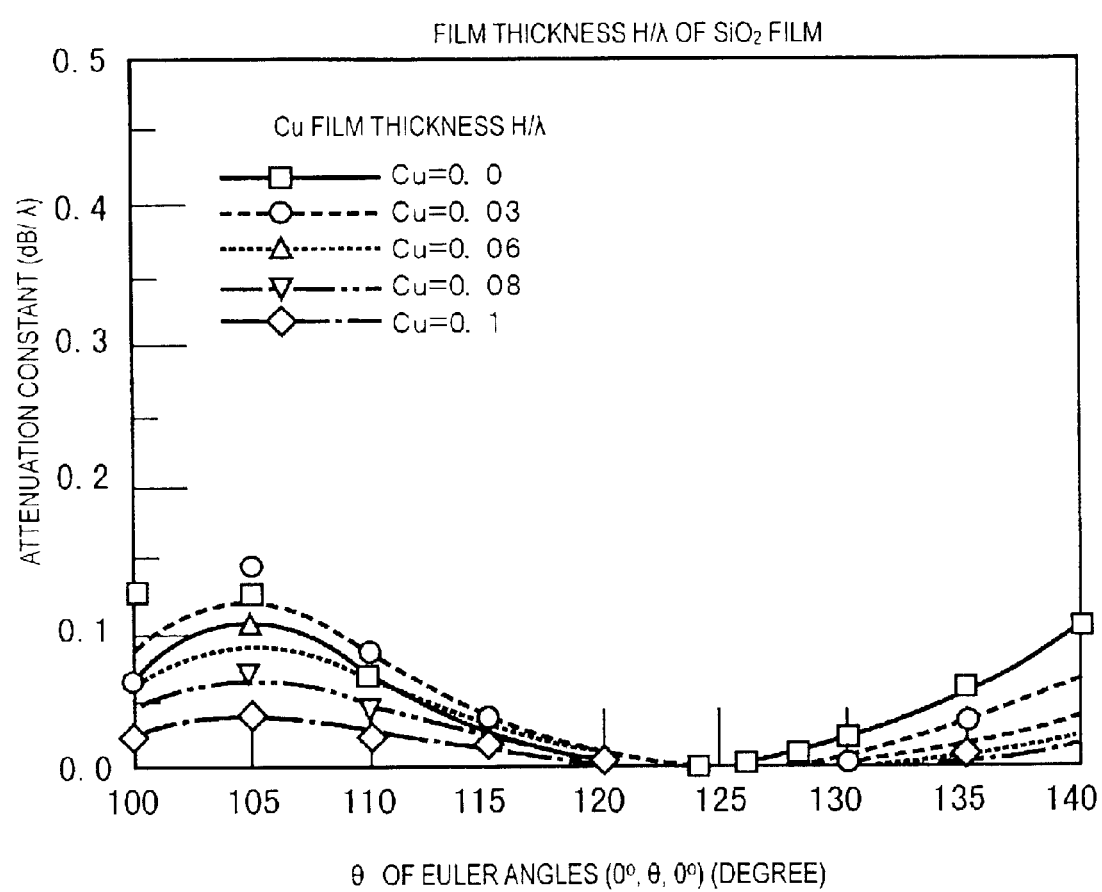
FIG. 9 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.15 are laminated.
Figure 10:
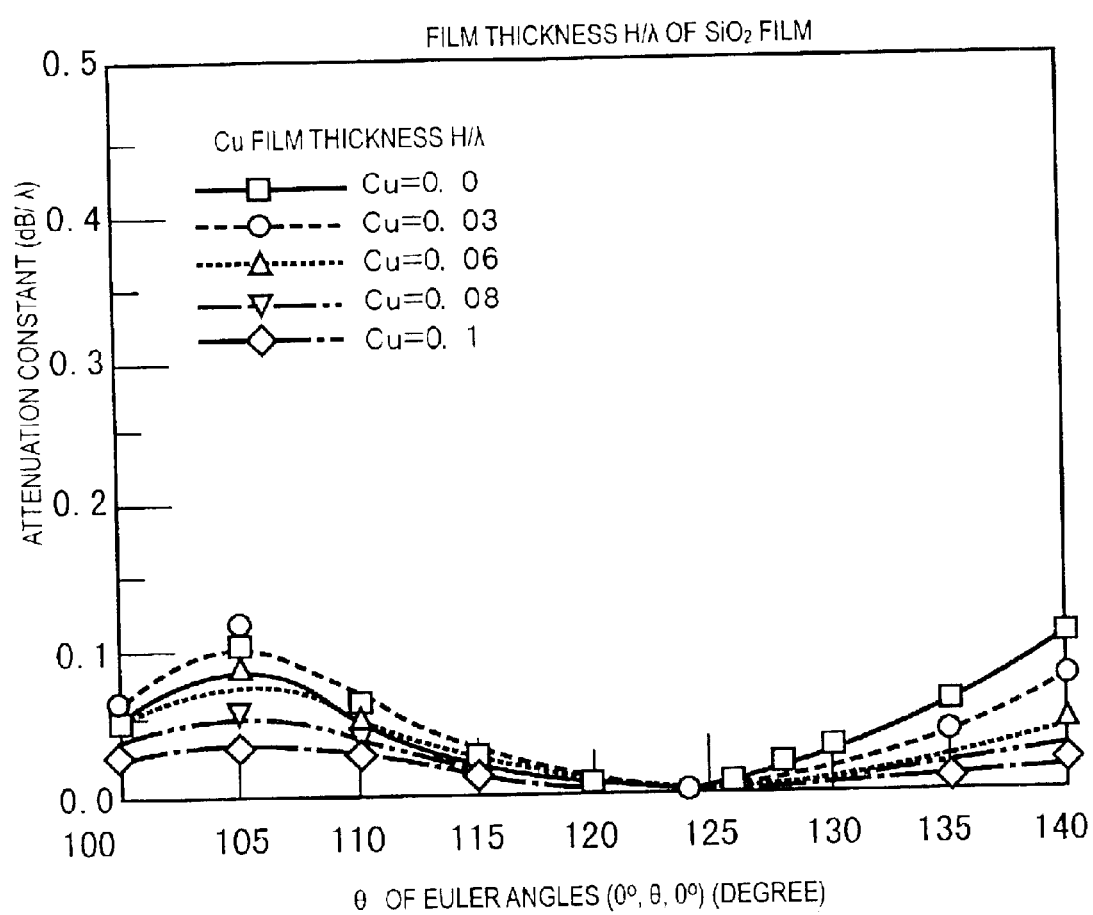
FIG. 10 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.2 are laminated.
Figure 11:
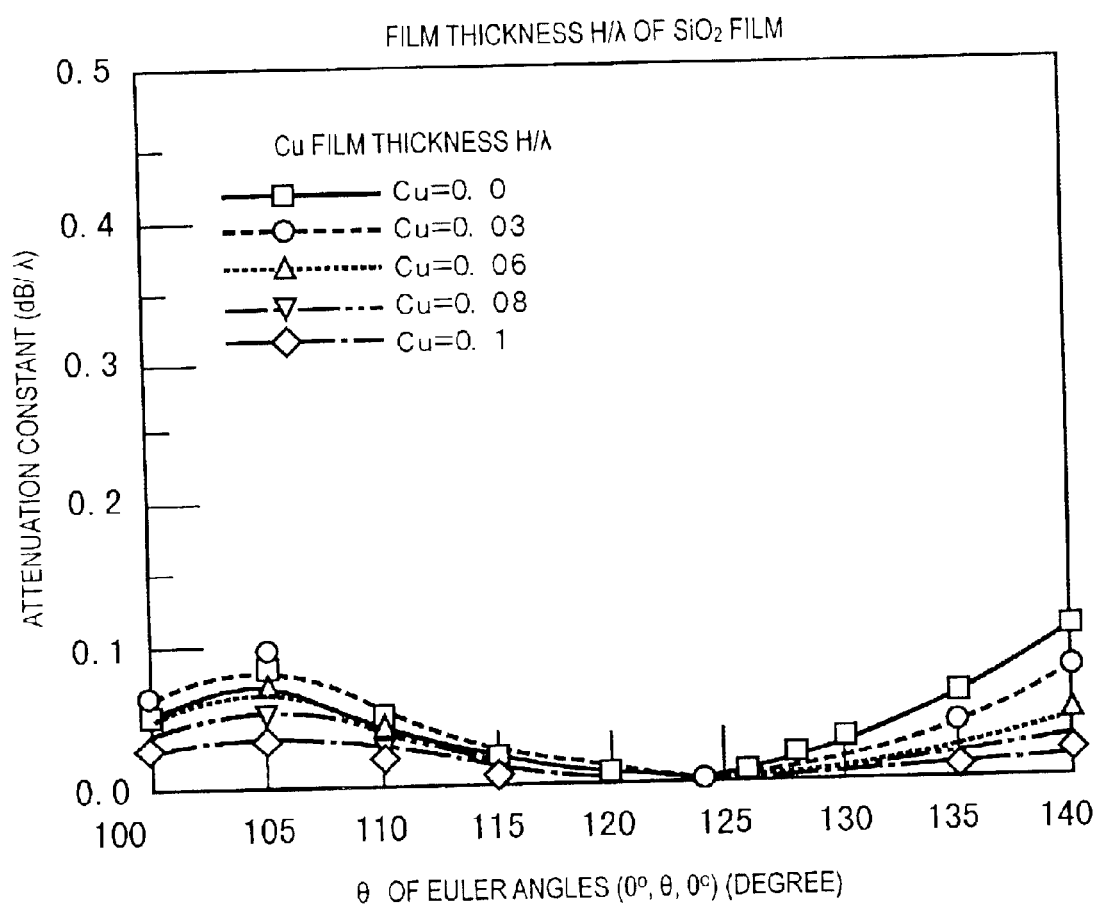
FIG. 11 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.25 are laminated.
Figure 12:
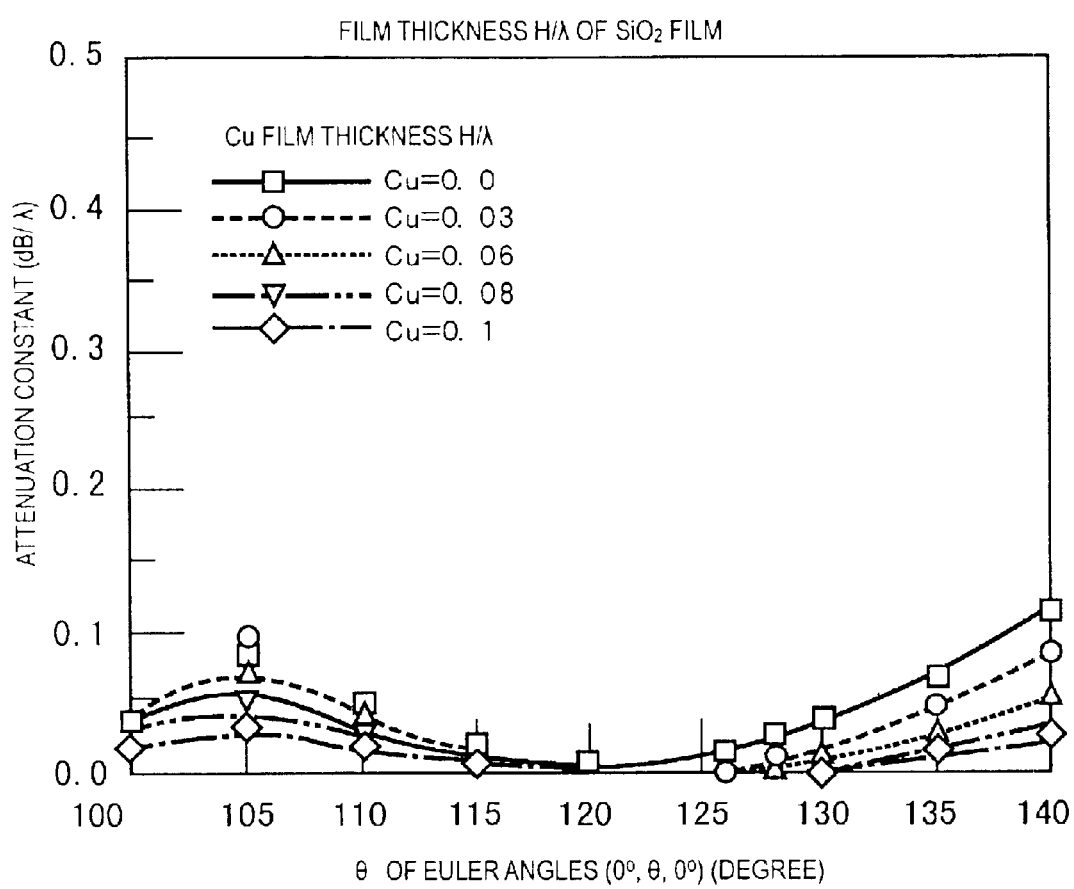
FIG. 12 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.3 are laminated.
Figure 13:
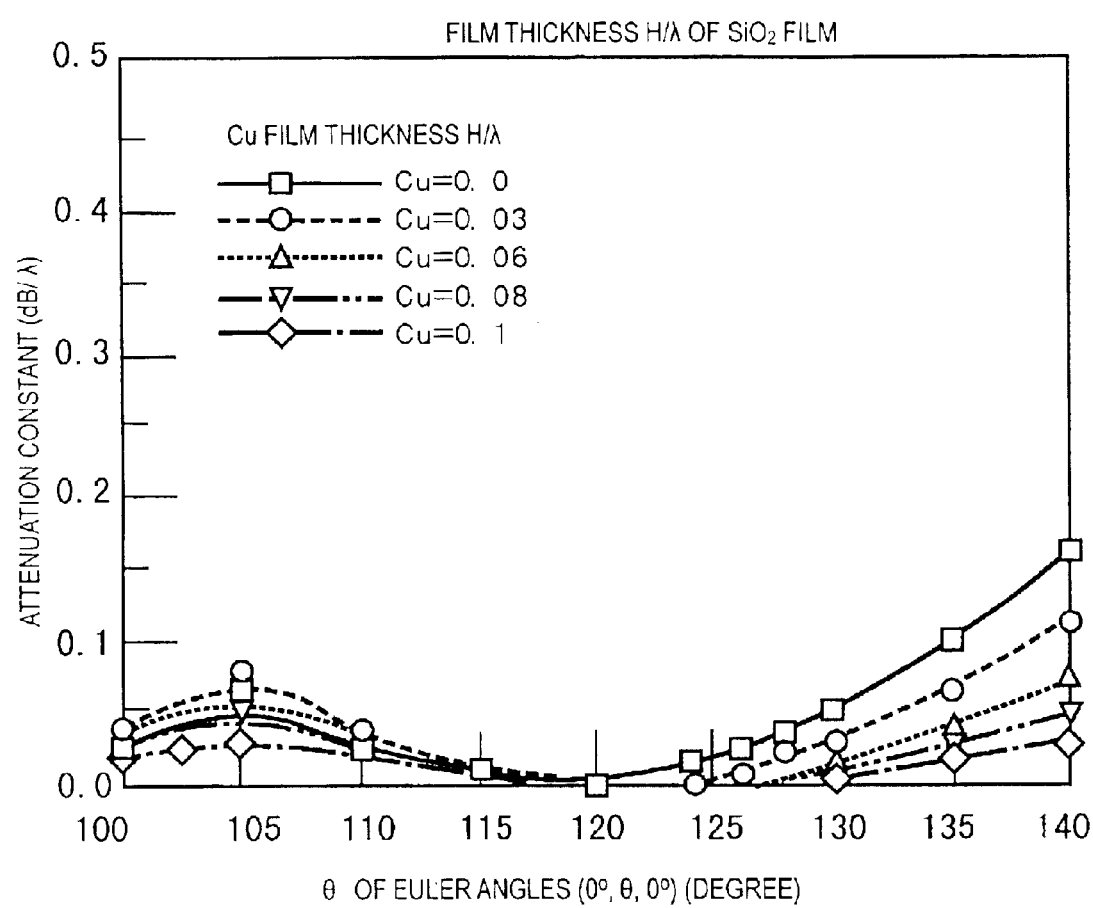
FIG. 13 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.35 are laminated.
Figure 14:
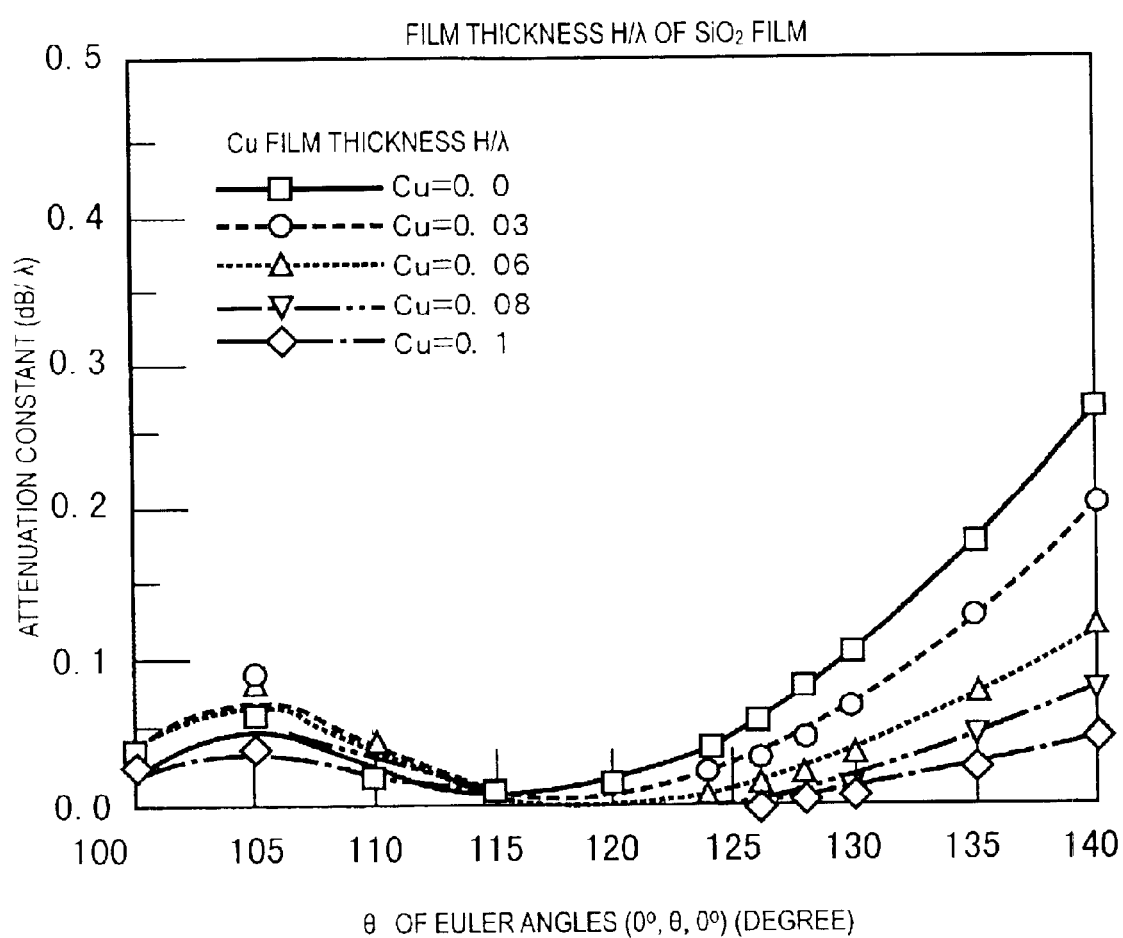
FIG. 14 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.4 are laminated.
Figure 15:
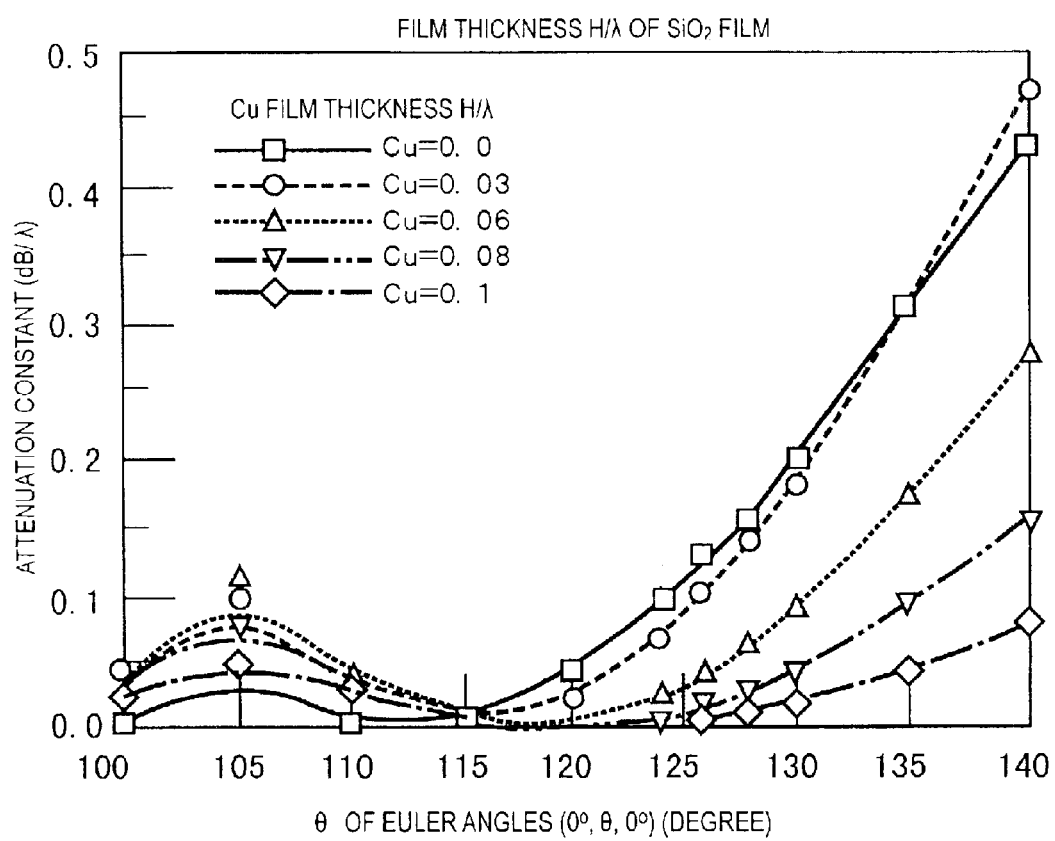
FIG. 15 is a diagram showing changes in the attenuation constant α when various Cu films having normalized film thicknesses H/λ of about 0.1 or less are arranged on respective $LiTaO_3$ substrates having Euler angles (0°, θ, 0°), and respective $SiO_2$ films having a normalized film thickness H/λ of about 0.45 are laminated.

On the other hand, FIG. 7 shows changes in the attenuation constant α when a Cu film having a normalized film thickness H/λ of about 0 to about 0.10 is arranged on a $LiTaO_3$ substrate having Euler angles (0°, 135°, 0°), and a $SiO_2$ film having a normalized film thickness H/λ of about 0 to about 0.5 is further arranged.

As is clear from FIG. 7, in the case where the $LiTaO_3$ substrate having the θ of 135° is used, even when the film thickness of the Cu film and the film thickness of the $SiO_2$ film are changed as described above, the attenuation constants α are large.

Consequently, it is clear that in order to realize an excellent TCF, a large electromechanical coefficient, and a small attenuation constant, the cut angle of the $LiTaO_3$ substrate, that is, the Euler angles, the film thickness of the $SiO_2$ film, and the film thickness of the electrode made of Cu must be combined while each of them is adjusted to be optimum.

Each of FIGS. 8 to 15 shows the relationship between the θ and the attenuation constant α when a Cu film having a normalized film thickness H/λ of about 0.08 or less is arranged on a $LiTaO_3$ substrate while the normalized film thickness H/λ of a $SiO_2$ film is approximately 0.1, 0.15, 0.2, 0.25, 0.3, 0.35, 0.4 or 0.45.

As is clear from FIGS. 8 to 15, in the case where the thickness H/λ of the Cu film is about 0.01 to about 0.08, when the thickness of the $SiO_2$ film and the θ of the Euler angles are chosen as shown in the following Table 5, the frequency temperature characteristic TCF becomes excellent, the electromechanical coefficient is greatly increased, and the attenuation constant α can be effectively controlled. Desirably, further excellent characteristics can be achieved when more preferable Euler angles shown in the right column of the following Table 5 are chosen.

TABLE 5

| $SiO_2$ film thickness | Euler angles of $LiTaO_3$ | More preferably |
|---|---|---|
| 0.15 to 0.18 | (0, 117 to 137, 0) | (0, 120 to 135, 0) |
| 0.18 to 0.23 | (0, 117 to 136, 0) | (0, 118 to 133, 0) |
| 0.23 to 0.28 | (0, 115 to 135, 0) | (0, 117 to 133, 0) |
| 0.28 to 0.33 | (0, 113 to 133, 0) | (0, 115 to 132, 0) |
| 0.33 to 0.38 | (0, 113 to 135, 0) | (0, 115 to 133, 0) |
| 0.38 to 0.4 | (0, 113 to 132, 0) | (0, 115 to 130, 0) |

As is clear from FIG. 2, when the θ of the Euler angles become about 125° or less, the electromechanical coefficient $K^2$ is increased by a large degree. Consequently, it is clear that the combinations of the normalized film thicknesses of the $SiO_2$ film and the Euler angles shown in the following Table 6 are more preferable.

TABLE 6

| $SiO_2$ film thickness | Euler angles of $LiTaO_3$ |
|---|---|
| 0.15 to 0.18 | (0, 117 to 125, 0) |
| 0.18 to 0.23 | (0, 117 to 125, 0) |
| 0.23 to 0.28 | (0, 115 to 125, 0) |
| 0.28 to 0.33 | (0, 113 to 125, 0) |
| 0.33 to 0.38 | (0, 113 to 125, 0) |
| 0.38 to 0.40 | (0, 113 to 125, 0) |

Figure 17:
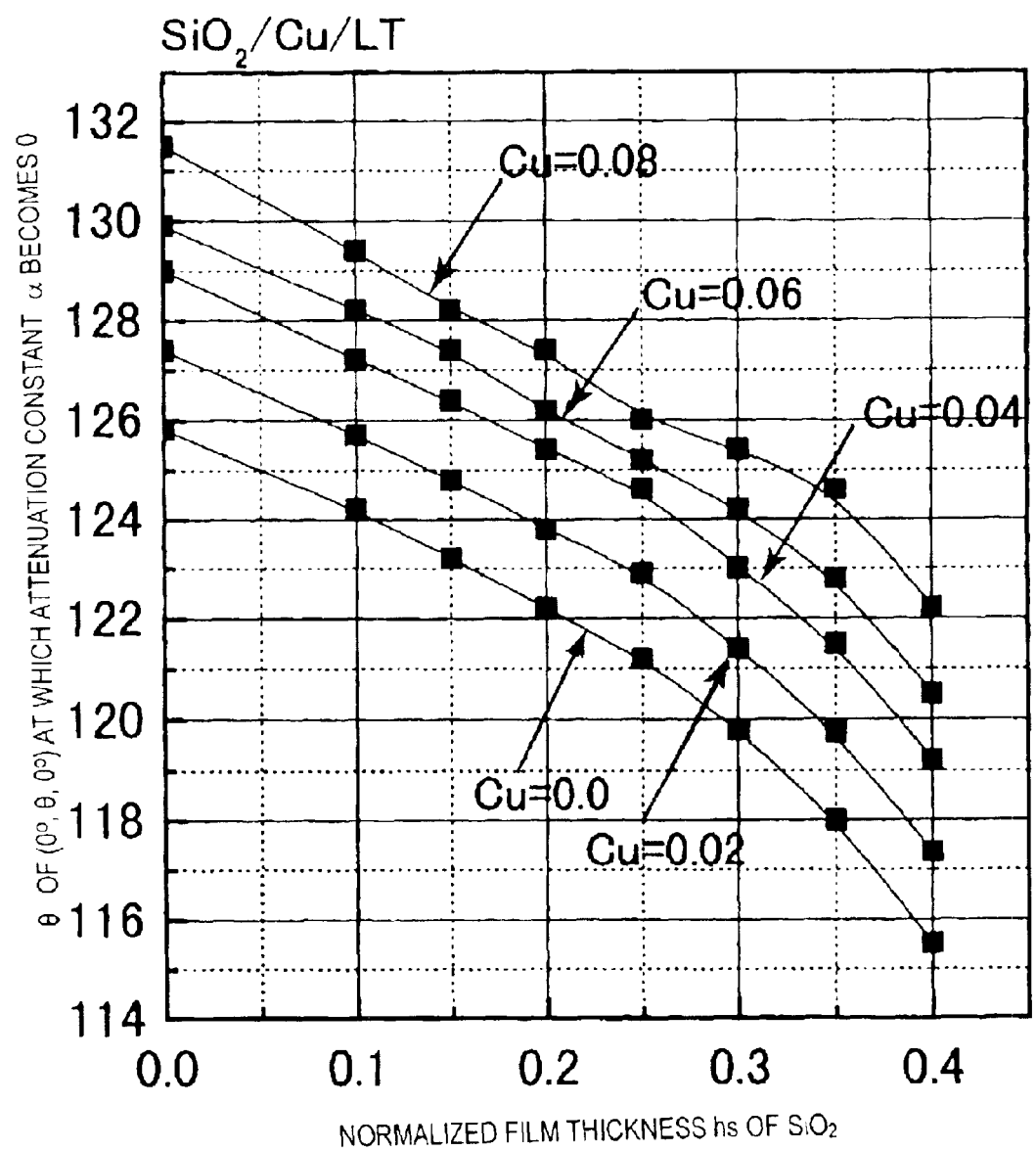
FIG. 17 is a diagram showing the relationship between the normalized film thickness hs of a $SiO_2$ film in order to realize the $\theta_{min}$ at which the attenuation constant becomes 0 or minimum and the normalized film thickness H/λ of a Cu film.
Figure 18A:
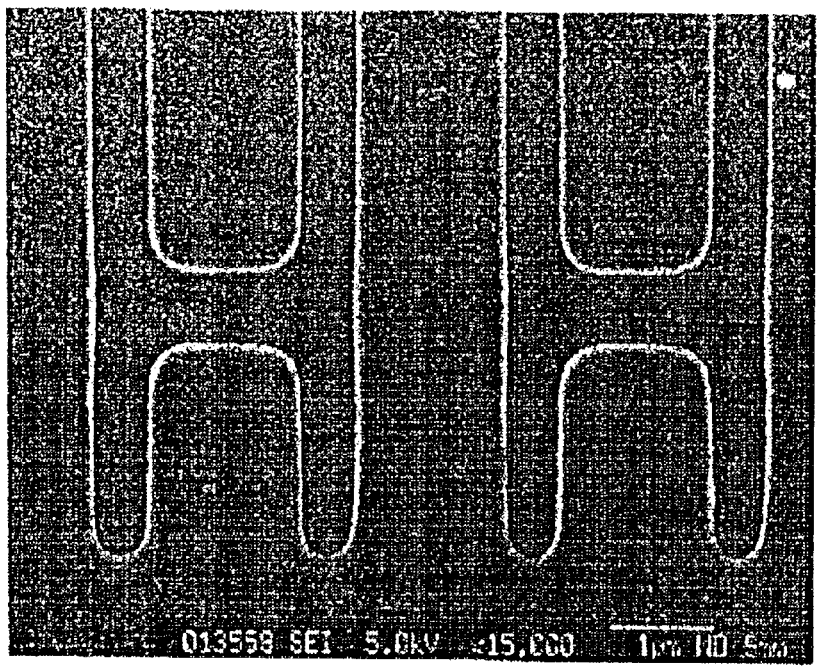
Figure 18B:
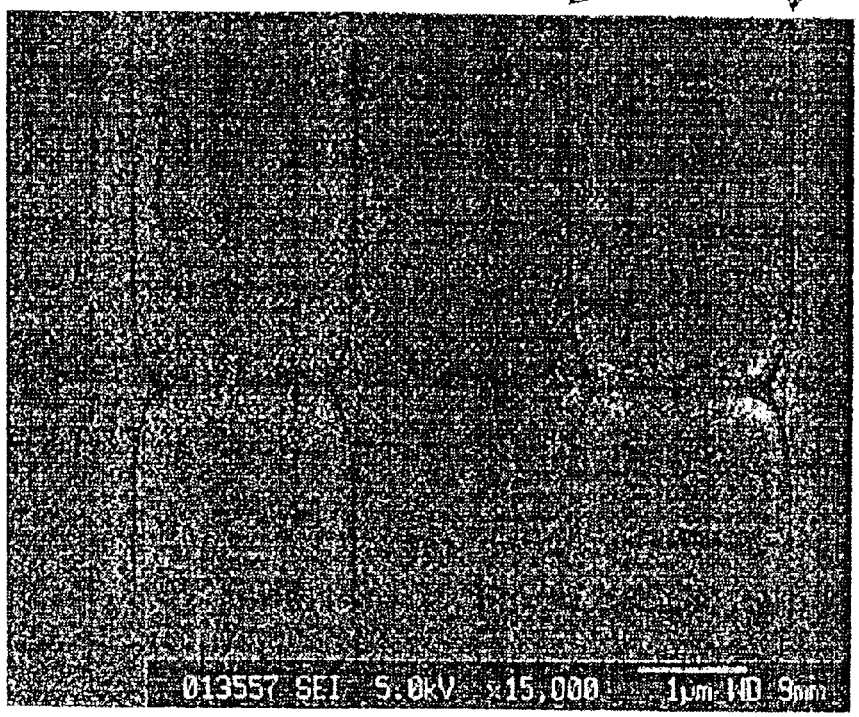

Furthermore, Euler angles, that is, the $\theta_{min}$, at which the attenuation constant became 0 or minimum were determined with respect to the normalized film thickness hs of a $SiO_2$ film and the normalized film thickness H/λ of a Cu film from the results shown in FIG. 5 to FIG. 14, and the results thereof are shown in FIG. 17.

Regarding the cases where the normalized film thicknesses H/λ of the Cu film are approximately 0, 0.02, 0.04, 0.06, and 0.08, each of the curves shown in FIG. 17 is approximated by a cubic polynomial and, therefore, the following Formulae A to E are obtained.

(a) when $0 < H/\lambda \leq 0.01$ $\theta_{min} = -139.713 \times hs^3 + 43.07132 \times hs^2 - 20.568011 \times hs + 125.8314$      Formula A (b) when $0.01 < H/\lambda \leq 0.03$ $\theta_{min} = -139.660 \times hs^3 + 46.02985 \times hs^2 - 21.141500 \times hs + 127.4181$      Formula B (c) when $0.03 < H/\lambda \leq 0.05$ $\theta_{min} = -139.607 \times hs^3 + 48.98838 \times hs^2 - 21.714900 \times hs + 129.0048$      Formula C (d) when $0.05 < H/\lambda \leq 0.07$ $\theta_{min} = -112.068 \times hs^3 + 39.60355 \times hs^2 - 21.186000 \times hs + 129.9397$      Formula D (e) when $0.07 < H/\lambda \leq 0.09$ $$\theta_{min} = -126.954 \times hs^3 + 67.40488 \times hs^2 - 29.432000 \times hs + 131.5686 \quad \text{Formula E}$$

Consequently, the θ of the Euler angles (0°, θ, 0°) is desirably specified to be the $\theta_{min}$ represented by the Formulae A to E. Furthermore, when $\theta_{min} - 2° < \theta \leq \theta_{min} + 2°$ is satisfied, the attenuation constant can be effectively reduced.

In preferred embodiments of the present invention, the IDT may be composed of Cu alone, or may be composed of a Cu alloy or a laminate of Cu and other metal as long as Cu is primarily included. It is preferred that the IDT primarily including Cu satisfies the following:

$$\rho(Cu) \times 0.7 \leq \rho(average) \leq \rho(Cu) \times 1.3$$

that is, $$6.25 \text{ g/cm}^3 \leq \rho(average) \leq 11.6 \text{ g/cm}^3,$$

where the average density of the electrode is denoted by ρ(average). An electrode made of a metal, for example, W, Ta, Au, Pt, Ag, and Cr, having a density larger than that of Al may be laminated on or under the Cu in order that the ρ(average) of the total electrode falls within the aforementioned range. In that case as well, effects similar to those in the case of a single layer of the Cu electrode can be achieved.

In the above-described experiment, the LiTaO₃ substrate having Euler angles (0°, θ, 0°) was used. In general, variations of about 0±3° occur regarding the Euler angles of the substrate material. However, the effects of preferred embodiments of the present invention can be achieved even within the range of such variations, that is, regarding the LiTaO₃ substrate of approximately (0±3°, 113° to 136°, 0±3°).

The present invention can be applied to not only the longitudinally coupled resonator type surface acoustic wave filter shown in FIG. 1, but also various surface acoustic wave apparatuses, for example, surface acoustic wave resonators, transversely coupled surface acoustic wave filters, ladder filters, and lattice filters.

In the surface acoustic wave apparatus according to preferred embodiments of the present invention, since at least one IDT primarily including Cu is arranged on the LiTaO₃ substrate having Euler angles (0±3°, 113° to 136°, 0±3°), and the SiO₂ film is arranged on the LiTaO₃ substrate while covering the IDT, the surface acoustic wave apparatus having a large electromechanical coefficient, excellent temperature characteristics, a reduced attenuation constant α, and a reduced propagation loss can be provided.

In preferred embodiments of the present invention, when the film thickness normalized by the wavelength of the surface acoustic wave of the IDT is within the range of about 0.01 to about 0.08, and the normalized film thickness of the SiO₂ film is within the range of about 0.15 to about 0.40, the electromechanical coefficient can be further increased, and excellent temperature characteristics can be realized.

Furthermore, when the film thickness H/λ of the IDT is about 0.01 to about 0.08, and the θ of the Euler angles of the LiTaO₃ substrate and the normalized film thickness H/λ of the SiO₂ are chosen as shown in Table 1, and more preferably, in Table 2, the surface acoustic wave apparatus having a larger electromechanical coefficient, further reduced attenuation constant α, and further excellent frequency temperature characteristic can be provided.

When the θ of the Euler angles (0°, θ, 0°) of the LiTaO₃ substrate is more than about $\theta_{min} - 2°$, but less than about $\theta_{min} + 2°$, the attenuation constant is further reduced. Consequently, the propagation loss can be further reduced.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave apparatus comprising:

a LiTaO₃ substrate having Euler angles of approximately (0±3°, 113° to 136°, 0±3°);

at least one IDT which is arranged on the LiTaO₃ substrate and which primarily includes Cu; and a SiO₂ film arranged on the LiTaO₃ substrate to cover the at least one IDT; wherein the film thickness H/λ of the at least one IDT normalized by the wavelength of the surface acoustic wave is about 0.01 to about 0.08;

the film thickness of the SiO₂ film normalized by the wavelength of the surface acoustic wave is within the range of about 0.15 to about 0.40; and the LiTaO₃ substrate, the at least one IDT and the SiO₂ film are arranged so as to utilize a leaky surface acoustic wave.

2. The surface acoustic wave apparatus according to claim 1, wherein the at least one IDT includes Cu in an amount such that $8.25 \text{ g/cm}^3 \leq \rho(average) \leq 11.8 \text{ g/cm}^3$, where the average density of the at least one IDT is denoted by ρ(average).

3. The surface acoustic wave apparatus according to claim 1, wherein:

a combination of the normalized film thickness of the SiO₂ film and the Euler angles of the LiTaO₃ substrate is any one of those shown in the following Table.

TABLE 1

| SiO₂ film thickness | Euler angles of LiTaO₃ |
|---|---|
| 0.15 to 0.18 | (0, 117 to 137, 0) |
| 0.18 to 0.23 | (0, 117 to 136, 0) |
| 0.23 to 0.28 | (0, 115 to 135, 0) |
| 0.28 to 0.33 | (0, 113 to 133, 0) |
| 0.33 to 0.38 | (0, 113 to 135, 0) |
| 0.38 to 0.40 | (0, 113 to 132, 0). |

4. The surface acoustic wave apparatus according to claim 3, wherein when the normalized film thickness of the SiO₂ film is represented by hs, θ of the Euler angles (0°, θ, 0°) falls within the range of the following Formula (1):

$$\theta_{min} - 2° < \theta \leq \theta_{min} + 2° \quad \text{Formula (1)}$$

where in the Formula (1), when the normalized film thickness H/λ of the at least one IDT is within the range of the following (a) to (e), the value of $\theta_{min}$ is represented by the following Formula A to E, respectively, (a) when $0 < H/\lambda \leq 0.01$ $$\theta_{min} = -139.713 \times hs^3 + 43.07132 \times hs^2 - 20.568011 \times hs + 125.8314 \quad \text{Formula A}$$

(b) when $0.01 < H/\lambda \leq 0.03$ $$\theta_{min} = -139.660 \times hs^3 + 46.02985 \times hs^2 - 21.141500 \times hs + 127.4181 \quad \text{Formula B}$$

(c) when $0.03 < H/\lambda \leq 0.05$ $\theta_{min} = -139.607 \times hs^3 + 48.98838 \times hs^2 - 21.714900 \times hs + 129.0048$    Formula C (d) when $0.05 < H/\lambda \leq 0.07$ $\theta_{min} = -112.068 \times hs^3 + 39.60355 \times hs^2 - 21.186000 \times hs + 129.9397$    Formula D (e) when $0.07 < H/\lambda \leq 0.09$ $\theta_{min} = -126.954 \times hs^3 + 67.40488 \times hs^2 - 29.432000 \times hs + 131.5686$    Formula E.

5. The surface acoustic wave apparatus according to claim 3, wherein the combination of the normalized film thickness of the $SiO_2$ and the Euler angles of the $LiTaO_3$ substrate is any one of those shown in the following Table.

TABLE 2

| $SiO_2$ film thickness | Euler angles of $LiTaO_3$ |
| --- | --- |
| 0.15 to 0.18 | (0, 117 to 125, 0) |
| 0.18 to 0.23 | (0, 117 to 125, 0) |
| 0.23 to 0.28 | (0, 115 to 125, 0) |
| 0.28 to 0.33 | (0, 113 to 125, 0) |
| 0.33 to 0.38 | (0, 113 to 125, 0) |
| 0.38 to 0.40 | (0, 113 to 125, 0). |

6. The surface acoustic wave apparatus according to claim 1, wherein the leaky surface acoustic wave primarily includes a shear horizontal wave used as the surface acoustic wave.

7. The surface acoustic wave apparatus according to claim 1, wherein the surface acoustic wave apparatus is one of a longitudinally coupled resonator filter, a surface acoustic wave resonator, a transversely coupled surface acoustic wave filter, a ladder filter, and a lattice filter.

8. The surface acoustic wave apparatus according to claim 1, further comprising a pair of IDTs and a pair of reflectors disposed on the $LiTaO_3$ substrate.

9. The surface acoustic wave apparatus according to claim 8, wherein the $SiO_2$ film is arranged so as to cover the pair of IDTs.

10. The surface acoustic wave apparatus according to claim 1, wherein the at least one IDT is made of only Cu.

11. The surface acoustic wave apparatus according to claim 1, wherein the at least one IDT includes a Cu alloy.

12. The surface acoustic wave apparatus according to claim 1, wherein the at least one IDT includes another metal in addition to Cu.

13. A surface acoustic wave apparatus comprising:

a $LiTaO_3$ substrate having Euler angles of approximately (0±3°, 113° to 136°, 0±3°);

at least one IDT which is arranged on the $LiTaO_3$ substrate and which primarily includes Cu; and a $SiO_2$ film arranged on the $LiTaO_3$ substrate to cover the at least one IDT; wherein the film thickness $H/\lambda$ of the at least one IDT normalized by the wavelength of the surface acoustic wave is about 0.01 to about 0.08;

the film thickness of the $SiO_2$ film normalized by the wavelength of the surface acoustic wave is within the range of about 0.1 to about 0.15; and the $LiTaO_3$ substrate, the at least one IDT and the $SiO_2$ film are arranged so as to utilize a leaky surface acoustic wave.

14. The surface acoustic wave apparatus according to claim 13, wherein the leaky surface acoustic wave primarily includes a shear horizontal wave used as the surface acoustic wave.

15. The surface acoustic wave apparatus according to claim 13, wherein the surface acoustic wave apparatus is one of a longitudinally coupled resonator filter, a surface acoustic wave resonator, a transversely coupled surface acoustic wave filter, a ladder filter, and a lattice filter.

16. The surface acoustic wave apparatus according to claim 13, further comprising a pair of IDTs and a pair of reflectors disposed on the $LiTaO_3$ substrate.

17. The surface acoustic wave apparatus according to claim 16, wherein the $SiO_2$ film is arranged so as to cover the pair of IDTs.

18. The surface acoustic wave apparatus according to claim 13, wherein the at least one IDT is made of Cu alone.

19. The surface acoustic wave apparatus according to claim 13, wherein the at least one IDT includes a Cu alloy.

20. The surface acoustic wave apparatus according to claim 13, wherein the at least one IDT includes another metal in addition to Cu.

21. The surface acoustic wave apparatus according to claim 13, wherein the at least one IDT includes Cu in an amount such that $6.25 \text{ g/cm}^3 \leq \rho(\text{average}) \leq 11.6 \text{ g/cm}^3$, where the average density of the at least one IDT is denoted by $\rho(\text{average})$.

* * * * *